United States Patent
Kim et al.

(10) Patent No.: US 10,861,783 B1
(45) Date of Patent: Dec. 8, 2020

(54) PRINTED CIRCUIT BOARD

(71) Applicant: SAMSUNG ELECTRO-MECHANICS CO., LTD., Suwon-si (KR)

(72) Inventors: Jung Soo Kim, Suwon-si (KR); Eun Young Hwang, Suwon-si (KR); Jin Won Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/776,128

(22) Filed: Jan. 29, 2020

(30) Foreign Application Priority Data

Nov. 27, 2019 (KR) .......................... 10-2019-0154378

(51) Int. Cl.
| | |
|---|---|
| *H05K 1/02* | (2006.01) |
| *H01L 23/498* | (2006.01) |
| *H01L 23/13* | (2006.01) |
| *H05K 3/20* | (2006.01) |
| *H01L 21/48* | (2006.01) |

(52) U.S. Cl.
CPC ........ *H01L 23/49838* (2013.01); *H01L 23/13* (2013.01); *H01L 23/49816* (2013.01); *H01L 23/49822* (2013.01); *H05K 1/0286* (2013.01); *H01L 21/4853* (2013.01); *H01L 21/4857* (2013.01); *H05K 3/20* (2013.01)

(58) Field of Classification Search
CPC ........ H05K 3/1275; H05K 3/202; H05K 3/20; H05K 3/24; H05K 3/205; H05K 3/207; H05K 1/0296; H05K 1/0298
USPC .................................................. 174/262–266
See application file for complete search history.

(56) References Cited

U.S. PATENT DOCUMENTS

| | | | |
|---|---|---|---|
| 5,369,881 A | 12/1994 | Inaba et al. | |
| 7,071,424 B1* | 7/2006 | Shirai | H05K 3/421 174/263 |
| 2012/0211269 A1* | 8/2012 | Saitou | H05K 3/38 174/260 |
| 2016/0141236 A1* | 5/2016 | Kurita | H01L 23/49822 361/761 |

FOREIGN PATENT DOCUMENTS

| | | |
|---|---|---|
| JP | 3361556 B2 | 1/2003 |
| KR | 10-2015-0080881 A | 7/2015 |

\* cited by examiner

*Primary Examiner* — Jeremy C Norris
(74) *Attorney, Agent, or Firm* — Morgan, Lewis & Bockius LLP

(57) ABSTRACT

A printed circuit board includes an insulating layer having a first surface and a second surface opposing the first surface; and a first wiring including a first line pattern disposed on the first surface of the insulating layer, and a plurality of first protruding patterns penetrating a portion of the insulating layer from the first surface and connected to the first line pattern, respectively, such that the plurality of first protruding patterns overlap the first line pattern in a plan view of the printed circuit board.

15 Claims, 5 Drawing Sheets

PRINTED CIRCUIT BOARD

CROSS-REFERENCE TO RELATED APPLICATION(S)

The present application claims the benefit of priority to Korean Patent Application No. 10-2019-0154378 filed on Nov. 27, 2019 in the Korean Intellectual Property Office, the disclosure of which is incorporated herein by reference in its entirety.

BACKGROUND

1. Field

The present disclosure relates to a printed circuit board.

2. Description of Related Art

Recently, in a package flip chip ball grid array (FCBGA) substrate, as an amount of data is increased and high-speed processing of data is required, demand for microcircuit technology is increasing. In addition, in the technology field, the adoption of materials having a low dielectric loss rate (Df) and a loss coefficient of thermal expansion (CTE) is increasing. Accordingly, securing adhesion of the circuit has emerged as a significant issue.

SUMMARY

An aspect of the present disclosure is to provide a printed circuit board including a wiring which may have high adhesion to an insulating layer.

According to an aspect of the present disclosure, a plurality of pattern holes are formed in advance in a position in which a line pattern of the insulating layer is to be formed. When forming the line pattern by plating, or the like, the plurality of pattern holes are also filled with a conductor, and a wiring having a plurality of protruding patterns is formed.

For example, according to an aspect of the present disclosure, a printed circuit board may include an insulating layer having a first surface and a second surface opposing the first surface; and a first wiring including a first line pattern disposed on the first surface of the insulating layer and a plurality of first protruding patterns penetrating a portion of the insulating layer from the first surface and connected to the first line pattern, respectively, such that the plurality of first protruding patterns overlap the first line pattern in a plan view of the printed circuit board.

According to another aspect of the present disclosure, a printed circuit board may include a first insulating layer; a first wiring including a first line pattern disposed on the first insulating layer and a first protruding pattern penetrating a portion of the first insulating layer and connected to the first line pattern; a first pad disposed on the first insulating layer, and connected to at least one end portion of the first wiring; and a first via penetrating the first insulating layer, and connected to the first pad. A depth of the first via may be larger than a depth of the first protruding pattern.

According to still another aspect of the present disclosure, a printed circuit board may include an insulating layer having a first surface and a second surface opposing the first surface, the first surface including a plurality of pattern holes partially penetrating the insulating layer and being spaced apart from one another by a first interval; and a first wiring including a first line pattern disposed along the first surface. The first wiring may further include a plurality of first protruding patterns extending from one surface of the first line pattern and to insides of the plurality of pattern holes, respectively.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
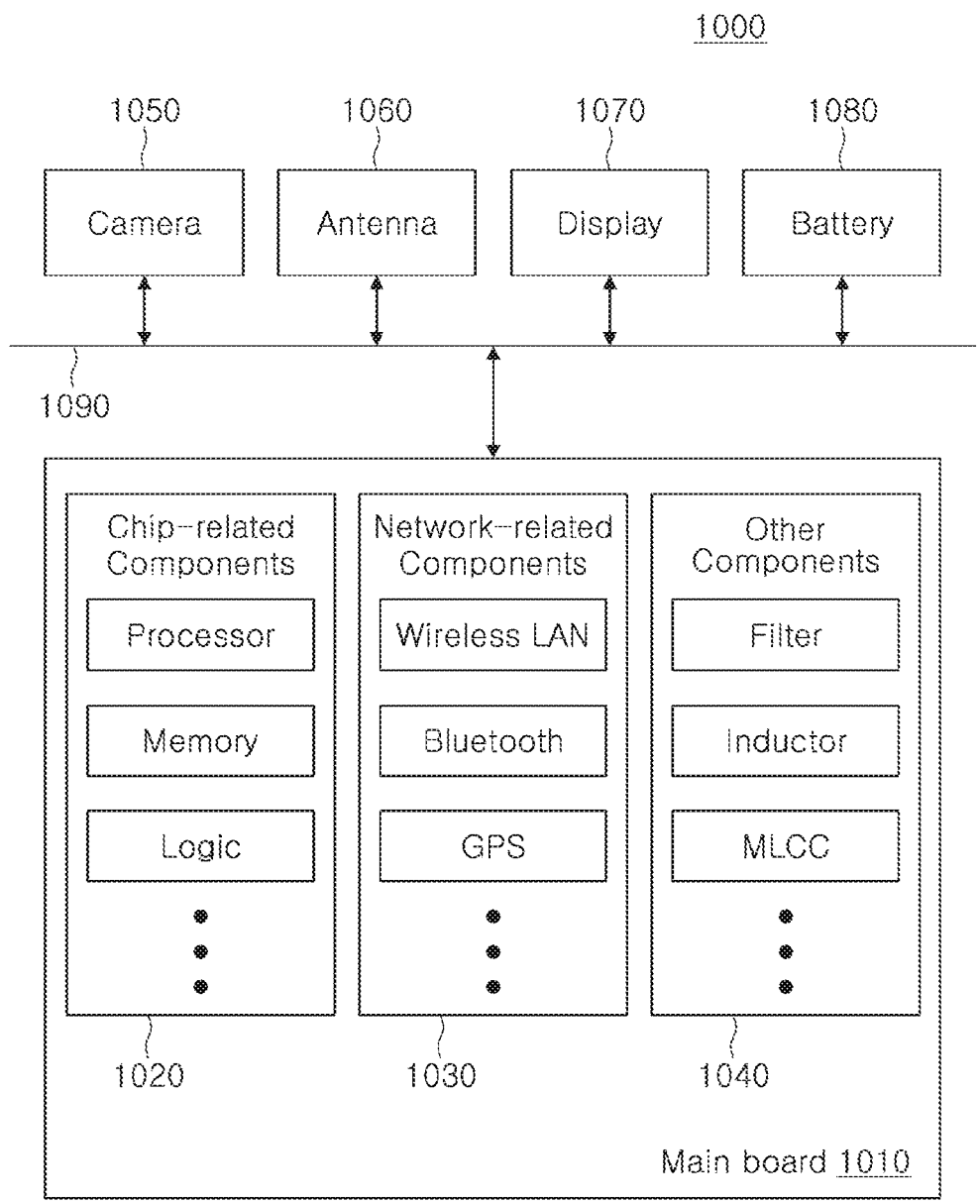
FIG. 1 is a schematic block diagram illustrating an example of an electronic device system.

Hereinafter, the present disclosure will be described with reference to the accompanying drawings. Shapes and dimensions of the elements in the drawings may be exaggerated or reduced for greater clarity of description.

Electronic Device

FIG. 1 is a schematic block diagram illustrating an example of an electronic device system.

Referring to FIG. 1, an electronic device 1000 may accommodate a motherboard 1010. The mother board 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, and may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
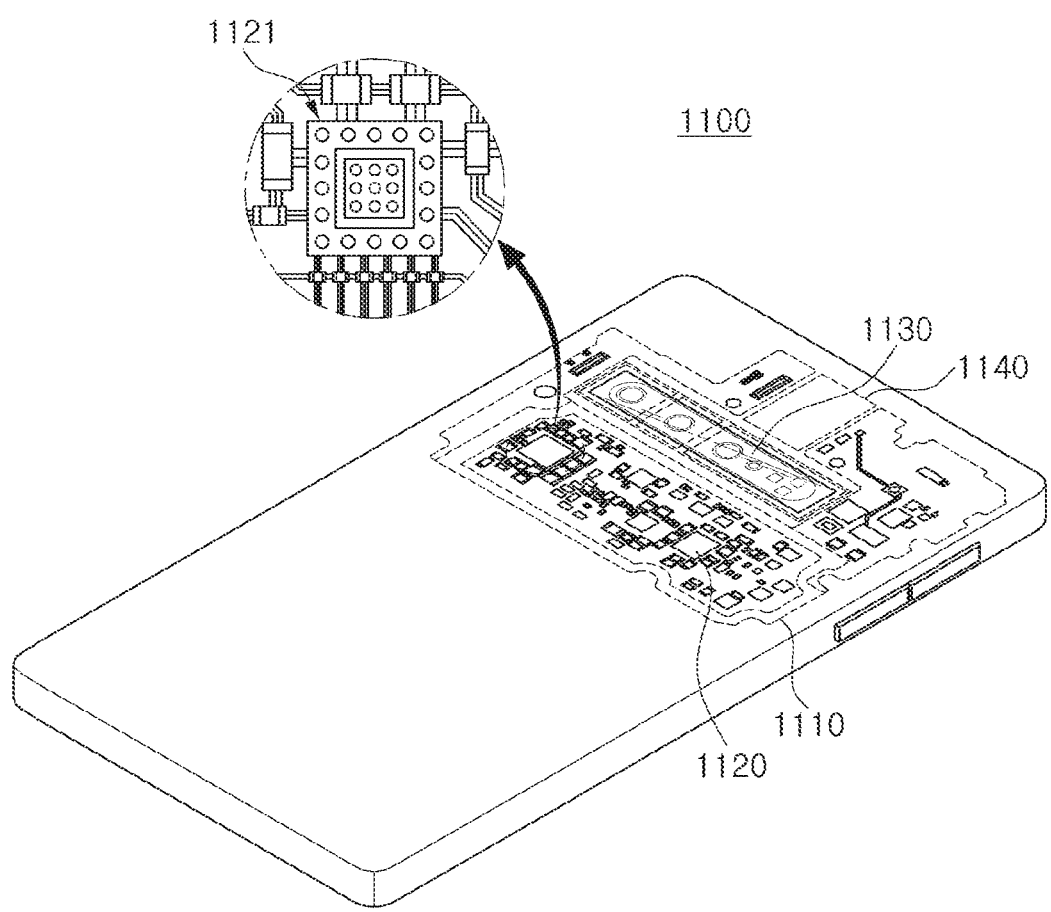
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in the smartphone 1100, and various electronic components 1120 may be physically and/or electrically connected to the mainboard 1110. In addition, other components that may or may not be physically or electrically connected to the printed circuit board 1110, such as a camera module 1130 and/or a speaker 1140, may be accommodated in the mainboard 1110. A portion of the electronic components 1120 may be chip related components, for example, a semiconductor package 1121, but are not limited thereto. The semiconductor package 1121 may be a surface mounted type, such as a semiconductor chip or a passive component on a package board of a multilayer printed circuit board, but is not limited thereto. Meanwhile, the electronic device is not necessarily limited to the smartphone 1100, but may be other electronic devices as described above.

Printed Circuit Board

Figure 3:
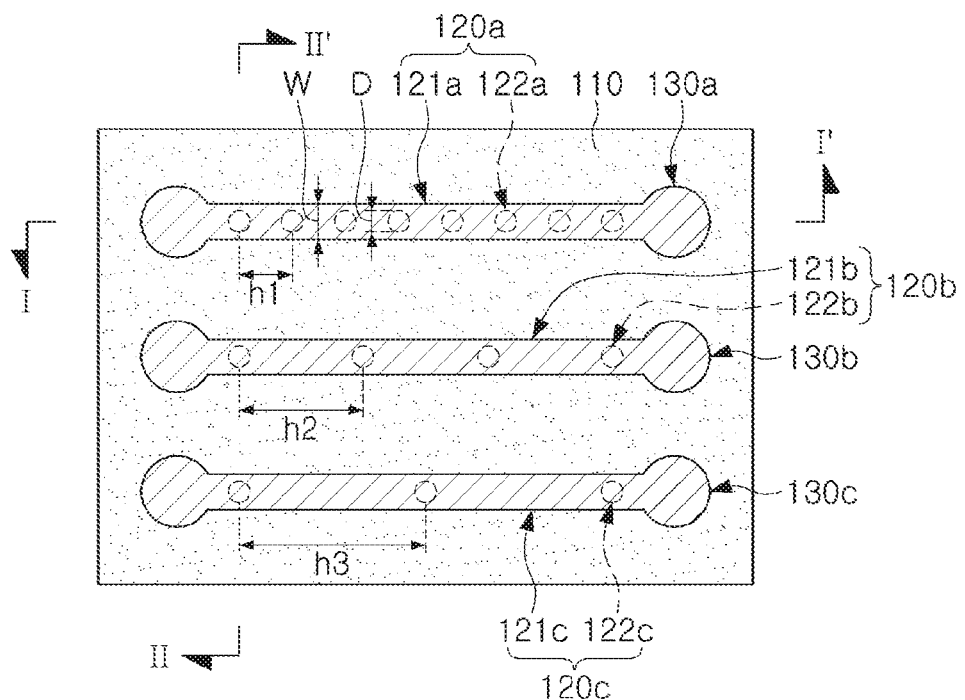
FIG. 3 is a schematic plan view of a printed circuit board according to an exemplary embodiment of the present disclosure.

FIG. 3 is a schematic plan view of a printed circuit board according to an exemplary embodiment of the present disclosure.

Figure 4:
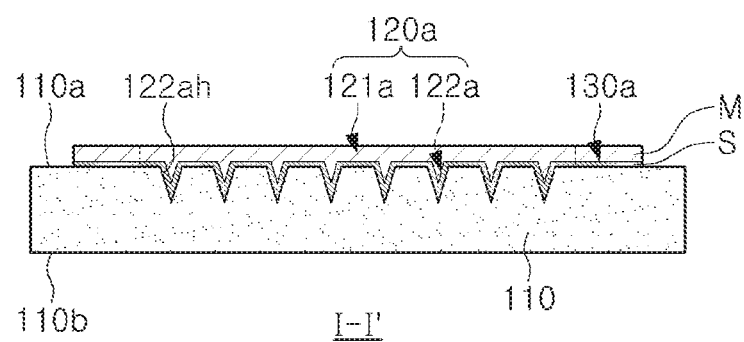
FIG. 4 is a schematic cross-sectional view taken along line I-I' of the printed circuit board of FIG. 3.

FIG. 4 is a schematic cross-sectional view taken along line I-I' of the printed circuit board of FIG. 3.

Figure 5:
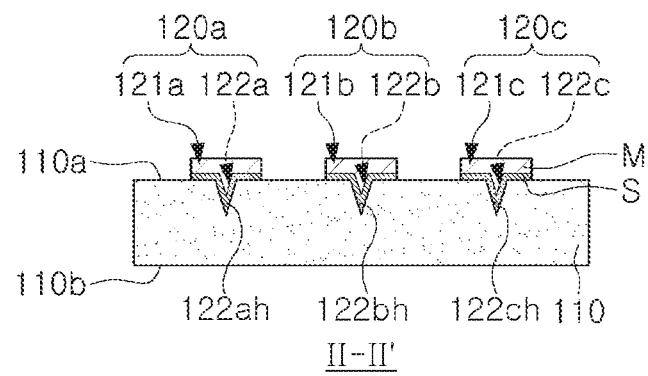
FIG. 5 is a schematic cross-sectional view taken along line II-II' of the printed circuit board of FIG. 3.

FIG. 5 is a schematic cross-sectional view taken along line II-II' of the printed circuit board of FIG. 3.

FIGS. 6A-6D are schematic plan views illustrating various planar shapes of the protruding pattern of FIG. 3.

Referring to the drawings, a printed circuit board 100 includes an insulating layer 110 having a first surface 110a and a second surface 110b opposing the first surface 110a and a first wiring 120a including a first line pattern 121a disposed on the first surface 110a of the insulating layer 110, and a plurality of first protruding patterns 122a penetrating a portion of the insulating layer 110, respectively, from the first surface 110a and connected to the first line pattern 121a, respectively, such that the plurality of first protruding patterns overlap the first line pattern 121a in a plan view of the printed circuit board 100.

Meanwhile, adhesion of a circuit generally formed by a semi additive process (SAP) or a modified SAP (MSAP) plating method may depend on roughness of a surface of an insulating material and adhesion between chemical copper plating layers. In order to secure the adhesion, curing conditions and desmear conditions of the insulating material should be optimized. However, this method has limitations, and requires a different structural approach.

On the other hand, in the printed circuit board 100 according to an exemplary embodiment, for example, a plurality of first pattern holes 122ah may be formed in advance in a position in which a first line pattern 121a of the insulating layer 110 is to be formed. When the first line pattern 121a is formed by plating, or the like, the plurality of first pattern holes 122ah may also be filled with peel plating to form a first wiring 120a having the plurality of first protruding patterns 122a. As a result, since a plurality of first protruding patterns 122a that can structurally hold the first line pattern 121a are formed below the first line pattern 121a, adhesion strength may be sufficiently improved. As such, as the adhesion is secured structurally, it may be possible to secure margins when optimizing working conditions of new insulating materials, and also to solve a problem of pattern delamination that often occurs in a non solder mask defined (NSMD) type products.

Meanwhile, each of the first protruding patterns 122a may not entirely penetrate the insulating layer 110. For example, each of the first protruding patterns 122a may penetrate the insulating layer 110 from the first surface 110a of the insulating layer 110 toward the second surface 110b, but may be physically spaced apart from the second surface 110b. Thereby, a sufficient insulation distance of the first wiring 120a can be secured.

In addition, the line width W of the first line pattern 121a may be larger than a largest width D of each of the first protruding patterns 122a. When the line width W of the first line pattern 121a is larger than the largest width D of each of the first protruding patterns 122a, in the forming thereof with a plating process, or the like, peel plating may sufficiently proceed, thereby ensuring excellent adhesion. In addition, it is possible to prevent occurrence of a short between line patterns formed at a fine pitch.

In addition, the first line pattern 121*a* may extend to each of the first protruding patterns 122*a* as an integrated piece without boundaries therebetween. In this case, the adhesion between each of the first line pattern 121*a* and the first protruding pattern 122*a* may be excellent, and thus, the structural adhesion to the insulating layer 110 may also be excellent.

In addition, the first wiring 120*a* may include a first metal layer S disposed on the first surface 110*a* of the insulating layer 110 and disposed on the plurality of first pattern holes 122*ah* penetrating a portion of the insulating layer 110, respectively, from the first surface 110*a* of the insulating layer 110 and overlapping the first line pattern 121*a* in the plan view of the printed circuit board 100, and a second metal layer M disposed on the first metal layer S and filling at least a portion of each of the plurality of first pattern holes 122*ah*. Here, the first metal layer S may be a seed layer formed by electroless plating, and the second metal layer M may be a plating layer formed by electrolytic plating, but is not limited thereto. In this case, the above-described integration may be much easier.

Figures 6A, 6B, 6C, 6D:
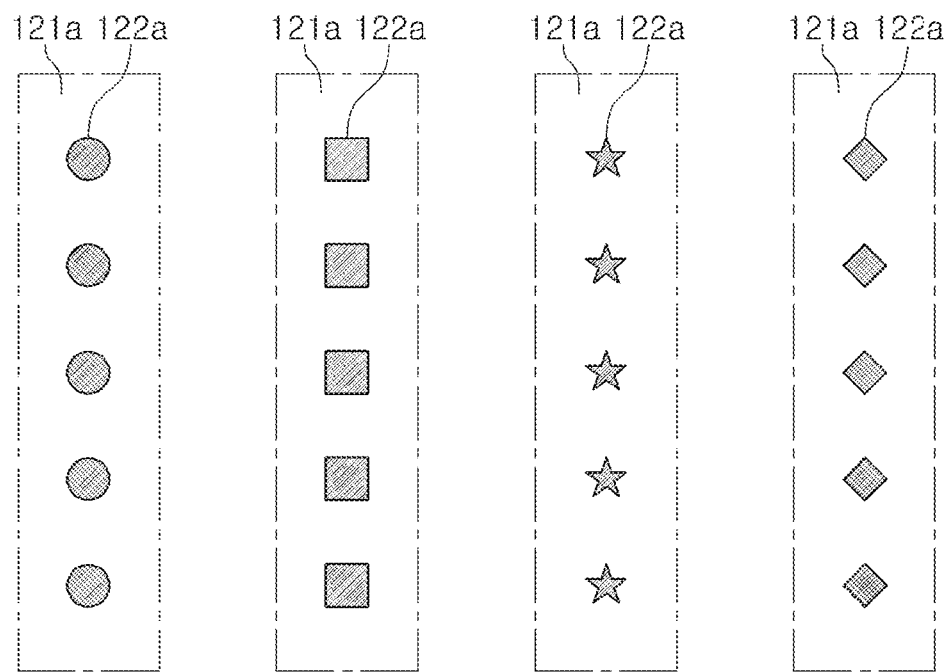
FIGS. 6A-6D are schematic plan views illustrating various planar shapes of the protruding pattern of FIG. 3.

In addition, planar shapes of each of the first protruding patterns 122*a* may be circular as shown in FIG. 6A, may be rectangular as shown in FIG. 6B, may be star-shaped as shown in FIG. 6C, and may be rhomboid as shown in FIG. 6D. As such, the shape of the first protruding pattern 122*a* may be various implemented.

In addition, a first pad 130*a* connected to at least one end portion of the first wiring 120*a* may be disposed on the first surface 110*a* of the insulating layer 110. The first pad 130*a* may be a pad for via connection for interlayer connection. Since the first pad 130*a* may be formed only at one end of the first wiring 120*a*, or may be formed at both ends thereof, and may be formed by the same plating process as the first wiring 120*a*, it may be integrated with the first wiring 120*a* without boundaries.

Meanwhile, the printed circuit board 100 according to an exemplary embodiment may further include a second wiring 120*b* including a second line pattern 121*b* disposed on the first surface 110*a* of the insulating layer 110, and a plurality of second protruding patterns 122*b* penetrating a portion of the insulating layer 110, respectively, from the first surface 110*a* and connected to the second line pattern 121*b*, respectively, such that the plurality of first protruding patterns overlap the first line pattern 121*b* in a plan view of the printed circuit board 100. For example, a plurality of second pattern holes 122*bh* may be formed in advance in a position in which a second line pattern 121*b* of the insulating layer 110 is to be formed. When the second line pattern 121*b* is formed by plating, or the like, the plurality of second pattern holes 122*bh* may also be filled with peel plating to form a second wiring 120*b* having the plurality of second protruding patterns 122*b*. As a result, since a plurality of second protruding patterns 122*b* that can structurally hold the second line pattern 121*b* are formed below the second line pattern 121*b*, adhesion strength may be sufficiently improved.

In this case, each of the second protruding patterns 122*b* may not entirely penetrate the insulating layer 110. For example, each of the second protruding patterns 122*b* may penetrate the insulating layer 110 from the first surface 110*a* of the insulating layer 110 toward the second surface 110*b*, but may be physically spaced apart from the second surface 110*b*. In addition, a line width of the second line pattern 121*b* may be wider than a widest width of each of the second protruding patterns 122*b*. In addition, the second line pattern 121*b* may also be integrated with each of the second protruding patterns 122*b* without boundaries. In addition, the second wiring 120*b* may include a first metal layer S disposed on the first surface 110*a* of the insulating layer 110 and disposed on the plurality of second pattern holes 122*bh* penetrating a portion of the insulating layer 110, respectively, from the first surface 110*a* of the insulating layer 110 and overlapping the second line pattern 121*b* in the plan view of the printed circuit board 100, and a second metal layer M disposed on the first metal layer S and filling at least a portion of each of the plurality of second pattern holes 122*bh*. In addition, planar shapes of each of the second protruding patterns 122*b* may be circular, square, star, or rhomboid. In addition, a second pad 130*b* connected at least one end portion of the second wiring 120*b* may be disposed on the first surface 110*a* of the insulating layer 110. Detailed descriptions are as described above.

Meanwhile, the printed circuit board 100 according to an exemplary embodiment may further include a third wiring 120*c* including a third line pattern 121*c* disposed on the first surface 110*a* of the insulating layer 110 and a plurality of third protruding patterns 122*c* connected to the third line pattern 121*c* so as to penetrate a portion of the insulating layer 110, respectively, from the first surface 110*a* and overlap the third line pattern 121*c* in the plan view of the printed circuit board 100. In the third wiring 120*c*, for example, a plurality of third pattern holes 122*ch* may be formed in advance in a position in which the third line pattern 121*c* of the insulating layer 110 is to be formed. When the third line pattern 121*c* is formed by plating, or the like, the plurality of third pattern holes 122*ch* may also be filled with peel plating to form a third wiring 120*c* having a plurality of third protruding patterns 122*c*. As a result, since a plurality of third protruding patterns 122*c* that can structurally hole the third line pattern 121*c* are formed below the third line pattern 121*c*, adhesion strength may be sufficiently improved.

In this case, each of the third protruding patterns 122*c* may not entirely penetrate the insulating layer 110. For example, each of the third protruding patterns 122*c* may penetrate the insulating layer 110 from the first surface 110*a* of the insulating layer 110 toward the second surface 110*b*, but may be physically spaced apart from the second surface 110*b*. In addition, a line width of the third line pattern 121*c* may be larger than a largest width of each of the third protruding patterns 122*c*. In addition, the third line pattern 121*c* may also be integrated with each of the third protruding patterns 122*c* without boundaries. In addition, the third wiring 120*c* may include a first metal layer S disposed on the first surface 110*a* of the insulating layer 110 and disposed on the plurality of third pattern holes 122*ch* penetrating a portion of the insulating layer 110, respectively, from the first surface 110*a* of the insulating layer 110 and overlapping the third line pattern 121*c* in the plan view of the printed circuit board 100, and a second metal layer M disposed on the first metal layer S and filling at least a portion of each of the plurality of third pattern holes 122*ch*. In addition, planar shapes of each of the third protruding patterns 122*c* may be circular, square, star, or rhomboid. In addition, a third pad 130*c* connected to at least one end portion of the third wiring 120*c* may be disposed on the first surface 110*a* of the insulating layer 110. Detailed descriptions are as described above.

Meanwhile, an interval h2 between the second protruding patterns 122*b* may be larger than an interval h1 between the first protruding patterns 122*a*. In addition, an interval h3 between the third protruding patterns 122*c* may be larger than the interval h2 between the second protruding patterns 122b. As such, an interval between the protruding patterns may be adjusted, may be arranged closely, and may be increased. In order to improve adhesion, it is preferable to arrange closely, but it is necessary to consider a process capability of peel plating, such that it may be necessary to have an appropriate interval.

Meanwhile, the printed circuit board 100 according to an exemplary embodiment may have a smaller number of wirings than the first to third wirings 120a, 120b, and 120c described above, or may have a larger number of wirings. In the case of having a larger number of wirings, the above-described descriptions may be applied to the wirings.

Hereinafter, the components of the printed circuit board 100 according to an exemplary embodiment will be described in more detail with reference to the accompanying drawings.

An insulating material may be used as a material of the insulating layer 110, and as the insulating material, a thermosetting resin such as an epoxy resin, a thermoplastic resin such as polyimide, or a material including a reinforcing material such as glass fiber (or glass cloth, glass fabric) and/or an inorganic filler, for example, a copper clad laminate (CCL), an unclad CCL, or the like may be used. Alternatively, prepreg, Ajinomoto Build-up Film (ABF), and the like, may be used. If necessary, photo imageable dielectric (PID) may be used as the material of insulating layers 521 and 531. However, the present disclosure is not limited thereto, and a material having a low dielectric loss ratio (Df) such as a liquid crystal polymer (LCP) may be used.

Metal materials may be used as materials of the wirings 120a, 120b, and 120c and the pads 130a, 130b, and 130c, and in this case, as the metal materials, copper (Cu), aluminum (Al), silver (Ag), or tin (Sn), gold (Au), nickel (Ni), lead (Pb), titanium (Ti), alloys thereof, or the like may be used. The wirings 120a, 120b, and 120c and the pads 130a, 130b, and 130c may be formed by a plating process such as an additive process (AP), a semi AP (SAP), a modified SAP (MSAP), tenting (TT), or the like. As a result, each of the wirings 120a, 120b, 120c and the pads 130a, 130b, and 130c may include a seed layer, which is an electroless plating layer, and an electrolytic plating layer, formed based on the seed layer. The pattern holes 122ah, 122bh, and 122ch on which the protruding patterns 122a, 122b, and 122c are formed may be formed by laser processing, or the like. The wirings 120a, 120b, and 120c and the pads 130a, 130b, and 130c may perform various functions according to designs of the corresponding layer. For example, they may include a ground pattern, a power pattern or pad, a signal pattern or pad, and the like. Here, the signal includes various signals except for ground, power, and the like, for example, data signals.

Figure 7:
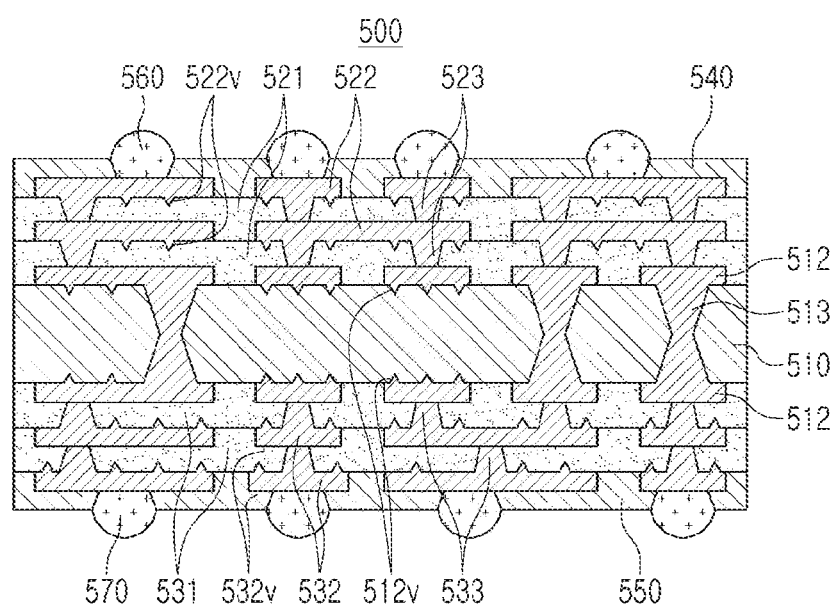
FIG. 7 is a schematic cross-sectional view of a printed circuit board according to another exemplary embodiment of the present disclosure.

FIG. 7 is a schematic cross-sectional view of a printed circuit board according to another exemplary embodiment of the present disclosure.

Referring to FIG. 7, a printed circuit board 500 according to another exemplary embodiment includes a core layer 510, a first wiring layer 512 disposed on upper and lower surfaces of the core layer 510, respectively, and a first via layer 513 penetrating the core layer 510 and connecting the first wiring layer 512 disposed at different levels. In addition, a plurality of first insulating layers 521 disposed on an upper side of the core layer 510, a plurality of second wiring layers 522 disposed on the plurality of first insulating layers 521, respectively, and a plurality of second via layers 523 penetrating the plurality of first insulating layers 521, respectively, and connecting the first and second wiring layers 512 and 522 disposed at different levels may be included. In addition, a plurality of third wiring layers 532 disposed on the plurality of second insulating layers 531 disposed on a lower side of the core layer 510, a plurality of third wiring layers 532 disposed on the plurality of second insulating layers 531, respectively, and a plurality of third via layers 533 penetrating the plurality of second insulating layers 531, respectively, and connecting the first and third wiring layers 512 and 532 disposed at different levels may be included. In addition, a first passivation layer 540 disposed on the plurality of first insulating layers 521, a plurality of first electrical connection metals 560 disposed on a plurality of openings of the first passivation layer 540, respectively, Meanwhile, the printed circuit board 500 according to another exemplary embodiment may be a multilayer printed circuit board to which a structure of the printed circuit board 100 according to the above-described exemplary embodiment is applied. For example, the wirings of each of the first to third wiring layers 512, 522, and 523 may include first to third protruding patterns 512v, 522v, and 523v as described above. If necessary, only the wiring of at least one of the first to third wiring layers 512, 522, and 523 may include a protruding pattern. The first to third protruding patterns 512v, 522v, and 523v may be connected to the line pattern at the corresponding position according to the position at which the first to third protruding patterns 512v, 522v, and 523v are formed, and may penetrate a portion of at least one of the core layer 510 and the first and second insulating layers 521 and 531. Depths of the first to third protruding patterns 512v, 522v, and 523v may be smaller than depths of the vias of each of the first to third via layers 513, 523, and 533. Here, the via of the second via layer 523 may connect pads disposed on different levels. For example, the via of the second via layer 523 may be a via connecting a pad connected to the wiring of the second wiring layer 522 disposed on the any one first insulating layer 521 and a pad connected to the wiring of the second wiring layer 522 disposed on the second insulating layer 531 disposed on a lower level than the any one first insulating layer 521.

Hereinafter, the components of the printed circuit board 500 according to another exemplary embodiment will be described in more detail with reference to the accompanying drawings.

The core layer 510 may be a core substrate, a center of the printed circuit board 500. In this case, as an insulating material, a thermosetting resin such as an epoxy resin, a thermoplastic resin such as polyimide, or a material including a reinforcing material such as glass fiber (or glass cloth, glass fabric) and/or an inorganic filler, for example, a copper clad laminate (CCL), an unclad CCL, or the like may be used, but is not limited thereto. A metal plate or a glass plate may be used as the core layer 510, and a ceramic plate may also be used. If necessary, a liquid crystal polymer (LCP) may be used as the material of the core layer 510. The core layer 510 may be thicker than thicknesses of each of the insulating layers 521 and 531 for the purpose of warpage control, and the like. In addition, the core layer 110 may be superior in terms of rigidity to each of the insulating layers 521 and 531 for the purpose of warpage control, and the like. For example, the core layer 510 may have a greater elastic modulus than each of the insulating layers 521 and 531. However, if necessary, the core layer 510 may be omitted, and in this case, the printed circuit board 500 according to another exemplary embodiment may be a coreless substrate.

The insulating layers 521 and 531 may provide insulating regions for forming multilayer wirings on both sides of the core layer 510. An insulating material may be used as a material of the insulating layers 521 and 531. In this case, as the insulating material, a thermosetting resin such as an epoxy resin, a thermoplastic resin such as polyimide, or a material including a reinforcing material such as an inorganic filler together with the above resin materials, for example, prepreg, an Ajinomoto Build-up Film (ABF) may be used. If necessary, a Photo-Imageable Dielectric (PID) may be used as the material of the insulating layers 521 and 531. Meanwhile, the insulating layers 521 and 531 may include the same material as each other, or may include different materials from each other. Boundaries of the insulating layers 521 and 531 may be clear or unclear.

A metal material may be used as a material of the wiring layers 512, 522, and 532. In this case, as the metal material, copper (Cu), aluminum (Al), silver (Ag), tin (Sn), gold (Au), nickel (Ni), lead (Pb), titanium (Ti), alloys thereof, or the like may be used. The wiring layers 512, 522, and 532 may be formed by using a plating process such as an additive process (AP), a semi AP (SAP), a modified SAP (MASP), tenting (TT), or the like, respectively. As a result, the wiring layers 512, 522, and 532 may include a seed layer, which is an electroless plating layer and an electrolytic plating layer formed based on the seed layer, respectively. The wiring layers 512, 522, and 532 may perform various functions depending on designs of corresponding layers. For example, the wiring patterns 512, 522, and 532 may include a ground pattern, a power pattern, a signal pattern, and the like. Here, the signal pattern includes various signals except for the ground pattern, the power pattern, and the like, such as, a data signal. These patterns may include a line pattern, a plane pattern, and/or a pad pattern.

A metal material may also be used as a material of the via layers 513, 523, and 533, and in this case, as the metal material, aluminum (Al), silver (Ag), tin (Sn), gold (Au), or nickel (Ni), lead (Pb), titanium (Ti), alloys thereof, or the like may be used. The via layers 513, 523, and 533 may be formed using a plating process such as AP, SAP, MSAP, and TT, respectively, and as a result, the via layers 513, 523, and 533 may include a seed layer, which is an electroless plating layer, and an electrolytic plating layer formed based on the seed layer, respectively. The via layers 513, 523, and 533 may vertically connect the wiring layers 512, 522, and 523 disposed at different levels. The via layers 513, 523, and 533 may also perform various functions due to designs of corresponding layers. For example, the via layers 513, 523, and 533 may include a wiring via for a signal connection, a wiring via for a ground connection, a wiring via for a power connection, and the like. The via of each of the via layers 513, 523, and 533 may be entirely filled with a metal material, or the metal material may be formed along a wall surface of a via hole. In addition, all known shapes in the art such as a cylindrical shape, an hourglass shape, a tapered shape may be applied. Meanwhile, the pattern hole for forming the protruding pattern may be formed by additional processing at the time of via processing, and in this case, a process may be added according to the type of laser sources, or the process may be performed by changing only a beam size or conditions.

The passivation layers 540 and 550 are an additional configuration for protecting an internal configuration of the printed circuit board 500 from external physical and chemical damages. The passivation layers 540 and 550 may include a thermosetting resin, respectively. For example, the passivation layers 540 and 550 may be ABFs, respectively. However, the present disclosure is not limited thereto, and each of the passivation layers 540 and 550 may be a known solder resist (SR) layer, respectively. In addition, if necessary, a PID may be included. The passivation layers 540 and 550 may have a plurality of openings, respectively, and the plurality of openings may expose at least a portion of each of the wiring layers disposed uppermost and lowermost among the wiring layers 522 and 523 from the passivation layers 540 and 550. Meanwhile, a surface treatment layer may be formed on the surfaces of the exposed wiring layers. The surface treatment layer may be, formed by, for example, electrolytic gold plating, electroless gold plating, organic solderability preservative (OSP) or electroless tin plating, electroless silver plating, electroless nickel plating/substituting plating, direct immersion gold (DIG) plating, hot air solder leveling (HASL), or the like. If necessary, each of the openings may be composed of a plurality of via holes. If necessary, an under bump metal (UBM) may be disposed on each of the openings in order to improve reliability.

The electrical connection metals 560 and 570 are an additional configuration that can physically and/or electrically connect the printed circuit board 500 externally. For example, electronic components may be mounted on the printed circuit board 500 according to an exemplary embodiment through a first electrical connection metal 560. In addition, the printed circuit board 500 according to an exemplary embodiment may be mounted on the other substrate such as a mainboard of the electronic device through a second electrical connection metal 570. For example, the printed circuit board 500 according to another exemplary embodiment may be a package substrate of a ball grid array (BGA) type. The electrical connection metals 560 and 570 may be disposed on the plurality of openings of the passivation layers 540 and 550, respectively. The electrical connection metals 560 and 570 may be composed of a low melting point metal having a lower melting point than copper (Cu), respectively, for example, tin (Sn) or an alloy containing tin (Sn). For example, the electrical connection metals 560 and 570 may be formed of solder, but this is merely an example, and a material thereof is not limited thereto.

The electrical connection metals 560 and 570 may be lands, balls, pins, or the like. The electrical connection metals 560 and 570 may be formed as multilayer structures or single layer structures. When the electrical connection metals 560 and 570 are formed of multilayer structures, the electrical connection metals 560 and 570 may include a copper pillar and a solder. When the electrical connection metals 560 and 570 are formed of a single layer, the electrical connection metals 560 and 570 may include a tin-silver solder, but this is merely an example, and the present disclosure is not limited thereto. The number, an interval, a dispositional form, and the like, of the electrical connection metals 160 and 170 are not particularly limited, but may be sufficiently modified depending on design particulars by those skilled in the art. The second electrical connection metal 570 may be for being mounted on the mainboard, and thus the number of the second electrical connection metals 570 may be greater than the number of the first electrical connection metals 560, and the sizes of the second electrical connection metals 570 may be greater than the size of the first electrical connection metals 560.

Other contents is substantially the same as described in the printed circuit board 100 according to the above-described exemplary embodiments, detailed descriptions thereof will be omitted.

As used herein, the terms "side portion," "side surface," and the like, are used to refer to a direction toward a first or second direction or a surface on said direction. The terms "upper side," "upper portion", "upper surface," and the like, are used to refer to a direction toward a third direction or a surface on said direction, while the terms "lower side," "lower portion," "lower surface," and the like, are used to refer to a direction opposing the direction toward the third direction or a surface on said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of right of the exemplary embodiments is not particularly limited to the above terms.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and do not necessarily refer to the same embodiment. Furthermore, the particular characteristics or features may be combined in any suitable manner in one or more embodiments. For example, a context described in a specific exemplary embodiment maybe used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

As set forth above, as one of various of effects of the present disclosure, a printed circuit board including a wiring which may have high adhesion to an insulating layer may be provided.

While exemplary embodiments have been shown and described above, it will be apparent to those skilled in the art that modifications and variations could be made without departing from the scope of the present invention as defined by the appended claims.

What is claimed is:

1. A printed circuit board, comprising:
an insulating layer having a first surface and a second surface opposing the first surface;
a first wiring including a first line pattern disposed on the first surface of the insulating layer, the first wiring further including a plurality of first protruding patterns penetrating a portion of the insulating layer from the first surface and connected to the first line pattern, respectively, such that the plurality of first protruding patterns overlap the first line pattern in a plan view of the printed circuit board; and
a second wiring including a second line pattern disposed on the first surface of the insulating layer, the second wiring further including a plurality of second protruding patterns penetrating a portion of the insulating layer from the first surface and connected to the second line pattern, respectively, such that the plurality of second protruding patterns overlap the second line pattern in a plan view of the printed circuit board,
wherein an interval between adjacent protruding patterns of the plurality of second protruding patterns is larger than an interval between adjacent protruding patterns of the plurality of first protruding patterns.

2. The printed circuit board of claim 1, wherein the plurality of first protruding patterns are spaced apart from the second surface of the insulating layer.

3. The printed circuit board of claim 1, wherein a line width of the first line pattern is larger than a largest width of each of the plurality of first protruding patterns.

4. The printed circuit board of claim 1, wherein the first line pattern extends to the plurality of first protruding patterns as an integrated piece without boundaries therebetween.

5. The printed circuit board of claim 4, wherein the first wiring comprises a first metal layer disposed on the first surface of the insulating layer and disposed on a plurality of first pattern holes each penetrating a portion of the insulating layer from the first surface and overlapping the first line pattern in a plan view of the printed circuit board, the first wiring further comprising a second metal layer disposed on the first metal layer and arranged in at least a portion of each of the plurality of first pattern holes.

6. The printed circuit board of claim 1, wherein a shape of each of the plurality of first protruding patterns in a plan view of the printed circuit board is circular, square, star, or rhomboid.

7. The printed circuit board of claim 1, further comprising a first pad disposed on the first surface of the insulating layer and connected to at least one end portion of the first wiring.

8. The printed circuit board of claim 1, further comprising a third wiring including a third line pattern disposed on the first surface of the insulating layer, the third wiring further including a plurality of third protruding patterns penetrating a portion of the insulating layer from the first surface and connected to the third line pattern, respectively, so as to overlap the third line pattern in the plan view,
wherein an internal between adjacent protruding patterns of the plurality of third protruding patterns is larger than the interval between the adjacent protruding patterns of the plurality of second protruding patterns.

9. A printed circuit board, comprising:
a first insulating layer and a second insulating layer disposed on one side of the first insulating layer;
a first wiring including a first line pattern disposed on the first insulating layer, and a plurality of first protruding patterns penetrating a portion of the first insulating layer and connected to the first line pattern;
a second wiring including a second line pattern disposed on the second insulating layer, and a plurality of second protruding patterns penetrating a portion of the second insulating layer and connected to the second line pattern;
a first pad disposed on the first insulating layer and connected to at least one end portion of the first wiring; and
a first via penetrating the first insulating layer and connected to the first pad,
wherein a depth of the first via is larger than a depth of each first protruding pattern, and
wherein an interval between adjacent protruding patterns of the plurality of second protruding patterns is larger than an interval between adjacent protruding patterns of the plurality of first protruding patterns.

10. The printed circuit board of claim 9, further comprising
a second pad disposed on the second insulating layer and connected to at least one end portion of the second wiring,
wherein the first via connects the first and second pads.

11. A printed circuit board, comprising:
an insulating layer having a first surface and a second surface opposing the first surface, the first surface including a plurality of pattern holes partially penetrating the insulating layer and being spaced apart from one another by a first interval;
a first wiring including a first line pattern disposed along the first surface; and
a second wiring including a second line pattern disposed on the first surface of the insulating layer, the second wiring further including a plurality of second protruding patterns penetrating a portion of the insulating layer from the first surface and connected to the second line pattern, respectively, such that the plurality of second protruding patterns overlap the second line pattern in a plan view of the printed circuit board,
wherein the first wiring further includes a plurality of first protruding patterns extending from one surface of the first line pattern and to insides of the plurality of pattern holes, respectively, and
wherein a second interval between adjacent protruding patterns of the plurality of second protruding patterns is larger than the first interval.

12. The printed circuit board of claim 11, wherein the plurality of first protruding patterns are spaced apart from the second surface of the insulating layer.

13. The printed circuit board of claim 11, wherein a line width of the first line pattern is larger than a largest width of each of the plurality of first protruding patterns.

14. The printed circuit board of claim 11, wherein the first line pattern extends to the plurality of first protruding patterns as an integrated piece without boundaries therebetween.

15. The printed circuit board of claim 11, further comprising a third wiring including a third line pattern disposed on the first surface of the insulating layer, the third wiring further including a plurality of third protruding patterns penetrating a portion of the insulating layer from the first surface and connected to the third line pattern, respectively, such that the plurality of third protruding patterns overlap the third line pattern in the plan view,
wherein an internal between adjacent protruding patterns of the plurality of third protruding patterns is larger than the second interval.

* * * * *